US006956419B1

(12) United States Patent
Mann et al.

(10) Patent No.: US 6,956,419 B1
(45) **Date of Patent: *Oct. 18, 2005**

(54) FAIL-SAFE ZERO DELAY BUFFER WITH AUTOMATIC INTERNAL REFERENCE

(75) Inventors: Eric N. Mann, Issaquah, WA (US); John J. Wunner, Woodinville, WA (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/833,357

(22) Filed: Apr. 28, 2004

Related U.S. Application Data

(63) Continuation of application No. 09/928,818, filed on Aug. 13, 2001, now Pat. No. 6,768,362.

(51) Int. Cl.[7] .......... H03L 7/00
(52) U.S. Cl. .......... 327/162; 327/147
(58) Field of Search .......... 327/162, 161, 327/141, 147, 156, 261

(56) References Cited

U.S. PATENT DOCUMENTS

| | | | | |
|---|---|---|---|---|
| 4,615,005 | A | 9/1986 | Maejima et al. | 364/200 |
| 4,633,193 | A | 12/1986 | Scordo | 327/113 |
| 4,686,386 | A | 8/1987 | Tadao | 307/269 |
| 4,787,097 | A | 11/1988 | Rizzo | 375/120 |
| 4,851,987 | A | 7/1989 | Day | 364/200 |
| 5,065,047 | A | 11/1991 | Igari et al. | 307/442 |
| 5,120,988 | A | 6/1992 | Matsuki | 307/269 |
| 5,136,180 | A | 8/1992 | Caviasca et al. | 307/269 |
| 5,175,845 | A | 12/1992 | Little | 395/550 |
| 5,223,931 | A | 6/1993 | Fernsler et al. | 348/540 |
| 5,260,979 | A | 11/1993 | Parker et al. | 375/108 |
| 5,388,265 | A | 2/1995 | Volk | 395/750 |
| 5,410,572 | A | 4/1995 | Yoshida | 375/376 |
| 5,502,689 | A | 3/1996 | Peterson et al. | 368/156 |
| 5,512,860 | A | 4/1996 | Huscroft et al. | 331/1 A |
| 5,541,943 | A | 7/1996 | Niescier et al. | 371/62 |
| 5,552,727 | A | 9/1996 | Nakao | 327/159 |
| 5,572,167 | A | 11/1996 | Alder et al. | 331/2 |
| 5,577,086 | A | 11/1996 | Fujimoto et al. | 375/376 |
| 5,634,131 | A | 5/1997 | Matter et al. | 395/750 |
| RE35,797 | E | 5/1998 | Graham et al. | 326/40 |
| 5,828,253 | A | 10/1998 | Murayama | 327/156 |
| 5,842,029 | A | 11/1998 | Conary et al. | 395/750.04 |
| 5,935,253 | A | 8/1999 | Conary et al. | 713/322 |
| 6,072,345 | A | 6/2000 | Ooishi | 327/157 |
| 6,104,251 | A | 8/2000 | Ramey et al. | 331/14 |
| 6,193,422 | B1 | 2/2001 | Belt et al. | 395/550 |
| 6,229,774 | B1 | 5/2001 | Yasuda | 369/47.28 |
| 6,236,278 | B1 | 5/2001 | Olgaard | 331/25 |
| 6,236,693 | B1 | 5/2001 | Haulin | 375/354 |
| 6,282,210 | B1 | 8/2001 | Rapport et al. | 370/516 |
| 6,433,599 | B2 | 8/2002 | Friedrich et al. | 327/165 |
| 6,636,575 | B1 * | 10/2003 | Ott | 375/376 |

* cited by examiner

*Primary Examiner*—Tuan T. Lam
*Assistant Examiner*—Cassandra Cox
(74) *Attorney, Agent, or Firm*—Christopher P. Maiorana, PC

(57) ABSTRACT

An apparatus comprising a first circuit and a second circuit. The first circuit may comprise a control circuit and an oscillator. The control circuit may be configured to generate a control signal in response to a first reference signal and a second reference signal. The oscillator may be configured to generate the second reference signal in response to the control signal and a timing signal. The control signal is generally held when the first reference signal is lost. The second circuit may be configured to generate one or more output signals in response to the second reference signal and one of the one or more output signals. The one or more output signals may have a controlled delay with respect to the first reference signal.

20 Claims, 3 Drawing Sheets

FAIL-SAFE ZERO DELAY BUFFER WITH AUTOMATIC INTERNAL REFERENCE

This is a continuation of U.S. Ser. No. 09/928,818, filed Aug. 13, 2001, now U.S. Pat. No. 6,768,362, issued Jul. 27, 2004.

FIELD OF THE INVENTION

The present invention relates to a method and/or architecture for implementing zero delay buffers generally and, more particularly, to a method and/or architecture for a zero delay buffer featuring an automatic reference loop which generates an internal reference clock that may be phase aligned to an externally supplied reference clock. In the event the externally supplied reference clock stops, the automatic reference loop will continue to supply an internal reference clock.

BACKGROUND OF THE INVENTION

A signal buffer that inserts essentially no additional propagation delay in the signal path is required for many applications. A phase locked loop (PLL) or delay locked loop (DLL) based zero delay buffer can address the requirement for essentially no additional propagation delay. A continuous clock, even in the event of loss of a reference signal, is also required for many applications.

Conventional timing systems can result in problems, for example, when used in communications systems that derive timing from incoming data streams. Loss of the data stream (due to storm, interference, etc.) can result in loss of circuit timing generation unless a backup timing source is available.

Conventional timing circuits can use backup reference oscillators to compensate for the loss of the primary timing reference. Conventional backup reference oscillators have multiplexers with external control logic to select between the primary and secondary (backup) reference oscillator where both the primary and secondary reference oscillator are located "off-chip". However, conventional technology has the following disadvantages:

(i) external control circuitry is required to control the reference selection multiplexer, (ii) the secondary reference is not phase aligned with the primary reference, (iii) a change from the primary reference to the secondary reference and back can result in an interruption of the clock, and/or (iv) a secondary reference source is required.

It would be desirable to have a zero delay buffer circuit that (i) has a reference oscillator phase aligned with a primary reference oscillator and (ii) automatically provides an internal reference clock if the primary reference stops.

SUMMARY OF THE INVENTION

The present invention concerns an apparatus comprising a first circuit and a second circuit. The first circuit may comprise a control circuit and an oscillator. The control circuit may be configured to generate a control signal in response to a first reference signal and a second reference signal. The oscillator may be configured to generate the second reference signal in response to the control signal and a timing signal. The control signal is generally held when the first reference signal is lost. The second circuit may be configured to generate one or more output signals in response to the second reference signal and one of the one or more output signals. The one or more output signals may have a controlled delay with respect to the first reference signal.

The objects, features and advantages of the present invention include providing a method and/or architecture for a zero delay buffer with an automatic reference clock that may (i) simplify the design of clock systems, (ii) reduce or eliminate complicated decision making/control logic, (iii) reduce or eliminate multiplexers, (iv) eliminate "off chip" backup reference oscillators, (v) provide a phase aligned (e.g., phase coherent) reference oscillator that provides uninterrupted operation when a primary timing reference signal is lost, (vi) provide a smooth, continuous reference oscillator operation when the primary timing reference signal is restored, (vii) provide continuous clocking in the event of data derived clock loss, (viii) handle clock management/switching internally as part of the chip architecture, and/or (ix) insert negligible propagation path delay.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
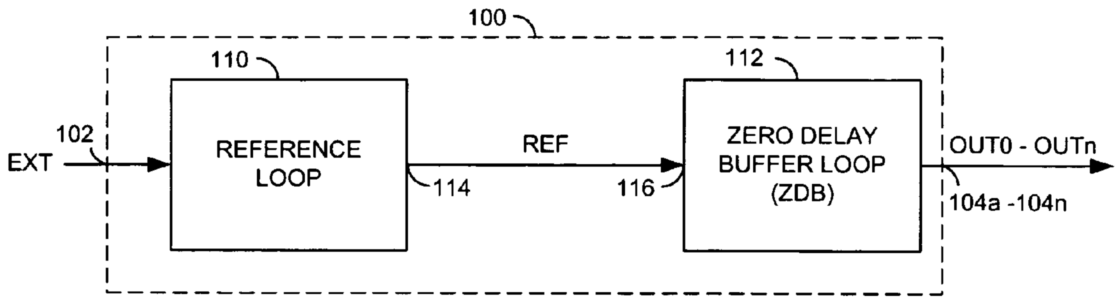
FIG. 1 is a block diagram of a preferred embodiment of the present invention.

Referring to FIG. 1, a block diagram of a circuit 100 is shown in accordance with a preferred embodiment of the present invention. In one example, the circuit 100 may be implemented as a fail-safe zero delay buffer with an automatic reference circuit. The circuit 100 may have an input 102 that may receive a signal (e.g., EXT) and one or more outputs 104*a*–104*n* that may present one or more signals (e.g., OUT0–OUTn). The signal EXT may be a clock signal. In one example, the signal EXT may be an external reference signal. The signal EXT may be used as a primary reference for a zero delay buffer circuit. The signals OUT0–OUTn may be, in one example, output clock signals that may be in phase with each other and the signal EXT. The circuit 100 may be configured to buffer a signal with essentially no additional propagation delay in the signal path. The circuit 160 may be configured to provide a continuous clock even when the signal EXT is lost.

The circuit 100 may be configured to control propagation path delay (e.g., provide advanced, retarded, and/or substantially zero delay) between the signal EXT and the signals OUT0–OUTn. The circuit 100 may be implemented on a single integrated circuit chip.

During normal operation, the circuit 100 may receive the signal EXT and present the signals OUT0–OUTn. However, when the signal EXT is lost, the circuit 100 may be configured to continue to generate (e.g., hold) the signals OUT0–OUTn at the last frequency presented by the signal EXT. The signals OUT0–OUTn may be presented without interruption and/or phase shift when the signal EXT is lost.

When the signal EXT is re-established, the circuit 100 may be configured to re-synchronize the signal REF to the signal EXT. In one example, the re-synchronization may be performed over several cycles of the signal EXT, gradually synchronizing the signals OUT0–OUTn with the signal EXT. The signals OUT0–OUTn may be presented without interruption and/or phase shift when the signal EXT is re-established.

The circuit 100 may comprise a circuit 110 and a circuit 112. The circuit 110 may be implemented as a reference loop circuit. The circuit 112 may be implemented as a zero delay buffer loop circuit. The circuit 110 may have an input that may receive the signal EXT and an output 114 that may present a signal (e.g., REF). The signal REF may be a clock signal. The signal REF may be used as a reference signal. The circuit 110 is generally configured to generate the signal REF in response to the signal EXT. The circuit 110 may be configured to adjust the phase and/or frequency of the signal REF in response to the signal EXT. The signal REF may be phase aligned with the signal EXT. When the signal EXT is lost, the circuit 110 may be configured to generate the signal REF with a phase and frequency similar to the phase and frequency of the signal EXT just before loss (e.g., a frequency hold feature).

The circuit 112 may have an input 116 that may receive the signal REF and one or more outputs that may present the signals OUT0–OUTn. The circuit 112 may be configured to generate the signals OUT0–OUTn in response to the signal REF.

Figure 2:
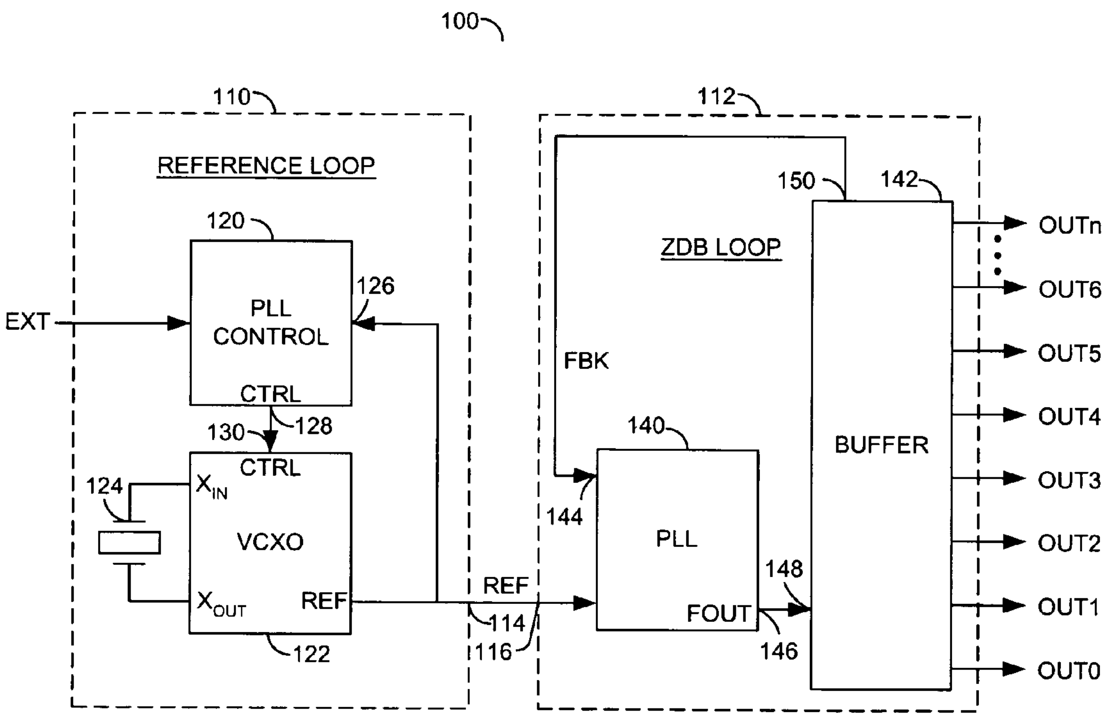
FIG. 2 is a detailed block diagram of a circuit implemented in accordance with a preferred embodiment of the present invention.

Referring to FIG. 2, a detailed block diagram of the circuit 100 is shown. In one example, the circuit 110 may comprise a circuit 120, a circuit 122, and a timing element 124. The circuit 120 may be implemented as a phase locked loop (PLL) control circuit. The circuit 122 may be implemented as a voltage controlled oscillator (VCO). In one example, the circuit 122 may be implemented as a voltage controlled crystal oscillator (VCXO). However, any suitable controllable oscillator (e.g., voltage controlled oscillator (VCO), current controlled oscillator (ICO), digitally controlled oscillator, digitally controlled crystal oscillator, etc.) may be implemented accordingly to meet the design criteria of a particular application. The timing element 124 may be implemented as a precision frequency reference (e.g., a crystal, a ceramic resonator, etc.). However, when low frequency drift is not required for a particular application, less precise frequency references (e.g., LC oscillator, RC oscillator, ring oscillator, etc.) may be implemented.

The circuit 120 may have an input that may receive the signal EXT, an input 126 that may receive the signal REF, and an output 128 that may present one or more signals (e.g., CTRL). The circuit 120 may be configured to generate the signal CTRL in response to a phase difference between the signal EXT and the signal REF. The signal CTRL may be used to control the phase and/or frequency of the signal REF. The circuit 120 may be configured to hold or not change the signal CTRL when the signal EXT is lost.

The circuit 122 may have an input that may receive a signal (e.g., XIN), an output that may present a signal (e.g., XOUT), an input 130 that may receive the signal CTRL, and an output that may present the signal REF. The signal XIN may be generated by the element 124. The circuit 122 may be configured to function as a reference oscillator in response the signal CTRL. The circuit 122 is generally configured to generate the signal REF in response to the signals XIN and CTRL. When the signal EXT is lost, the circuit 122 may continue to generate the signal REF at the last frequency and/or phase set by the signal CTRL. When the signal EXT is re-acquired, the circuit 122 may be configured to re-synchronize the signal REF with the signal EXT in response to the signal CTRL without interruption and/or phase shift. In one example, the amount of phase and frequency change over time of the circuit 122 may be reduced by temperature compensation configured to increase long-term stability.

The circuit 112 may comprise a circuit 140 and a circuit 142. The circuit 140 may be implemented as a PLL circuit. The circuit 142 may be implemented as a buffer circuit. The circuit 140 may have an input that may receive the signal REF, an input 144 that may receive a signal (e.g., FBK), and an output 146 that may present a signal (e.g., FOUT). The signal FBK may be a feedback signal. In one example, the signal FBK may be an output of the circuit 142 that is fed back to the circuit 140. The signal FBK may have the same phase relationship to the signal REF as the signals OUT0–OUTn. Since the signal REF may have the same phase relationship as the signal EXT, the signals OUT0–OUTn may have the same phase relationship as the signal EXT. The signal FOUT may be a clock signal. The circuit 140 may be configured to generate the signal FOUT in response to the signals REF and FBK.

The circuit 142 may have an input 148 that may receive the signal FOUT, one or more outputs that may present the signals OUT0–OUTn, and an output 150 that may present the signal FBK. The circuit 142 may be configured to generate the signals OUT0–OUTn and FBK in response to the signal FOUT. Alternatively, the circuit 142 may be configured to generate the signal FBK in response to an external signal which may enable deskew of external circuits or wiring.

Figure 3:
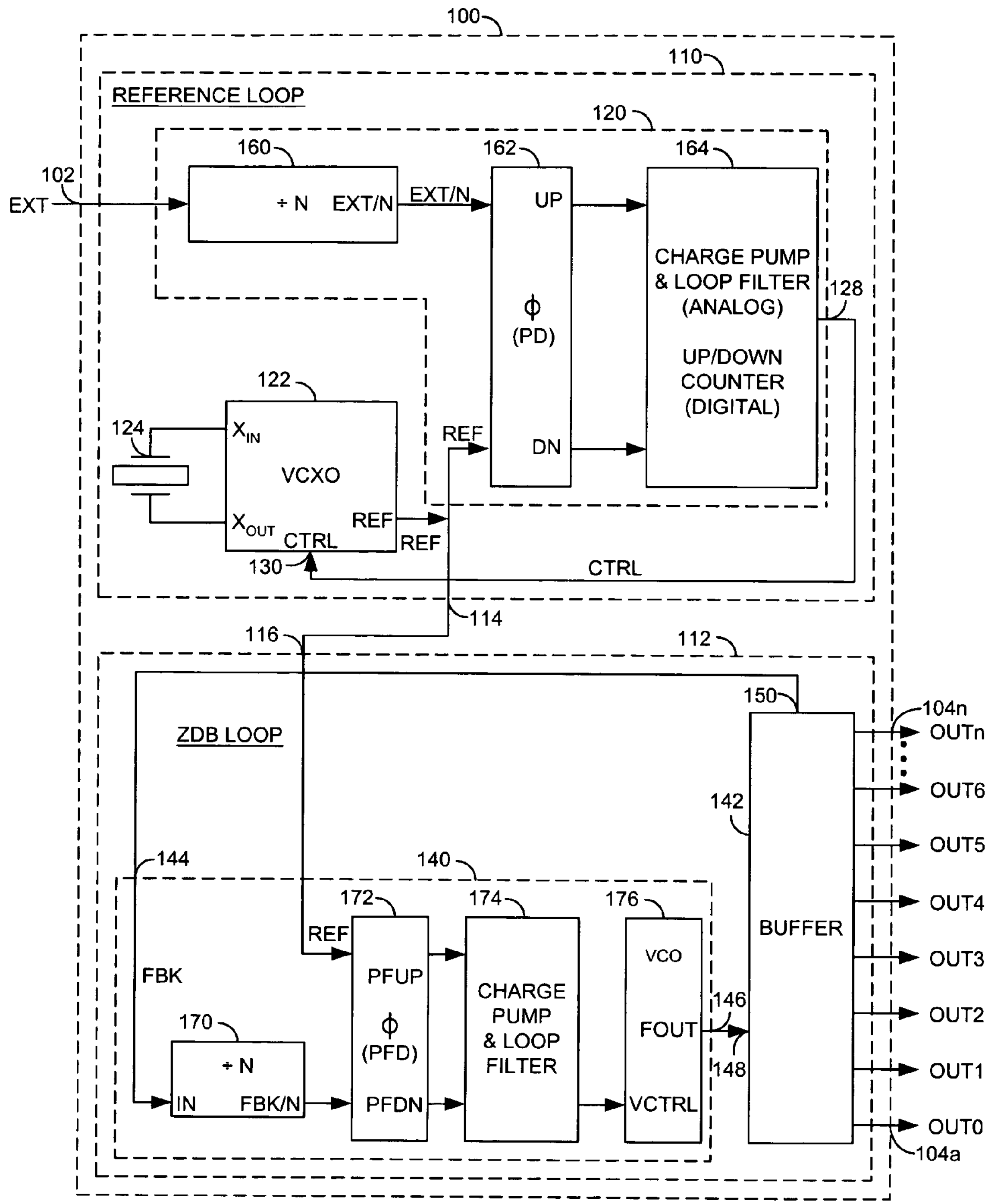
FIG. 3 is a more detailed block diagram of the circuit of FIG. 2.

Referring to FIG. 3, a more detailed block diagram of the circuit 100 is shown. In one example, the circuit 110 may be implemented as either an analog or digital loop circuit. When the circuit 110 is implemented as an analog reference loop circuit, the circuit 120 may comprise, in one example, a circuit 160, a circuit 162, and a circuit 164. The circuit 160 may be implemented as a divide-by-N circuit, where N is an integer. The circuit 162 may be implemented as a phase detector circuit. The circuit 164 may be implemented as an analog charge pump and loop filter circuit. When the circuit 110 is implemented as a digital loop circuit, the circuit 164 may be implemented as an up/down counter.

The circuit 160 may have an input that may receive the signal EXT and an output that may present a signal (e.g., EXT/N). The signal EXT/N may be a clock signal having a frequency equal to the frequency of the signal EXT divided by N. The circuit 160 may provide cost savings by allowing the operating frequency of the circuit 122 to be lower than the frequency of the signal EXT. For example, when the frequency of the signal EXT is 100 Mhz and the maximum frequency of the circuit 122 is 55 Mhz, the signal EXT may be divided by 2 (e.g., N=2) with the circuit 122 operating at 50 Mhz. Configuring the circuit 160 to provide division by 2, 4 and/or 8 may enable the circuit 100 to operate with the signal EXT having frequencies up to 250 Mhz while the circuit 122 has an operating frequency of 32 Mhz or less. In one example, implementing the circuit 160 as a divide-by-4 may provide sufficient frequency range for most common applications. However, any value of N may be implemented accordingly to meet the design criteria of a particular application. In an alternative embodiment of the circuit 110 (not shown), an additional divide-by-N circuit may be implemented similarly to the circuit 160 and configured to divide-by-N the signal REF that is presented to the circuit 120.

The circuit 162 may have an input that may receive the signal EXT/N, an input that may receive the signal REF, an output that may present a signal (e.g., UP), and an output that may present a signal (e.g., DN). The signals UP and DN may be control signals. The signals UP and DN may be used to control the phase of the signal REF. The circuit 162 may be configured to generate the signal UP and the signal DN in response to a phase difference between the signal EXT/N and the signal REF. The circuit 122 may be configured with a fixed tuning range that is less than an octave to avoid aliasing of the signal REF. When the circuit 122 is implemented with a fixed tuning range, the circuit 162 is generally implemented as a phase detector (PD) rather than a phase frequency detector (PFD). If the circuit 122 tunes more than an octave, the circuit 162 is generally implemented as a phase frequency detector (PFD).

The circuit 164 may have an input that may receive the signal UP, an input that may receive the signal DN, and an output that may present the signal CTRL. The circuit 164 may be configured to generate the signal CTRL in response to the signals UP and DN. The circuit 122 may be configured to shift the frequency of the signal REF in response to the signal CTRL. The circuit 122 may comprise a parallel resonant circuit that has an operating point that may be shifted in response to the signal CTRL. The operating point may be shifted, in one example, by changing a capacitance of the circuit 122 proportionally to the signal CTRL. When the circuit 164 is implemented as an analog charge pump and loop filter circuit, the signal CTRL may represent a voltage presented to a variable capacitance tuning varactor diode to change the capacitance. When the circuit 164 is implemented as a digitally controlled up/down counter, the circuit 122 is generally implemented as a digitally controlled VCXO. In one example, the signal CTRL may be implemented as a multi-bit digital control signal. The signal CTRL may control the operating point of a parallel resonant circuit by changing the capacitance of the circuit 122 in proportion to the signal CTRL.

The circuit 140 may comprise a circuit 170, a circuit 172, a circuit 174, and a circuit 176. The circuit 170 may be implemented as a divide-by-N circuit, where N is an integer. The circuit 170 may be implemented similarly to the circuit 160. The circuit 172 may be implemented as a phase-frequency detector circuit. The circuit 174 may be implemented as a charge pump and loop filter circuit. The circuit 176 may be implemented as a voltage controlled oscillator (VCO).

The circuit 170 may have an input that may receive the signal FBK and an output that may present a signal (e.g., FBK/N). The signal FBK/N may be a clock signal having a frequency equal to the frequency of the signal FBK divided by N where N is an integer.

The circuit 172 may have an input that may receive the signal REF, an input that may receive the signal FBK/N, an output that may present a signal (e.g., PFUP), and an output that may present a signal (e.g., PFDN). The signals PFUP and PFDN may be control signals (e.g., pump-up and pump-down signals, respectively). The signals PFUP and PFDN may be used to control the phase and/or frequency of the signal FOUT. The circuit 172 may be configured to generate the signals PFUP and PFDN in response to the phase and/or frequency difference between the signals REF and FBK/N.

The circuit 174 may have an input that may receive the signal PFUP, an input that may receive the signal PFDN, and an output that may present a signal (e.g., VCTRL). The signal VCTRL may be used to control the frequency and/or phase of the signal FOUT. The circuit 174 may be configured to generate the signal VCTRL in response to the signals PFUP and PFDN. The signal VCTRL may be implemented, for example, as a single-ended or differential signal or a multi-bit digital control signal.

The circuit 176 may have an input that may receive the signal VCTRL and an output that may present the signal FOUT. The circuit 176 may be configured to generate the signal FOUT in response to the signal VCTRL. The circuit 170 and the circuit 176 may cooperate to generate the signals OUT0–OUTn having a frequency that is an integer multiple of the frequency of the signal REF.

Figure 4:
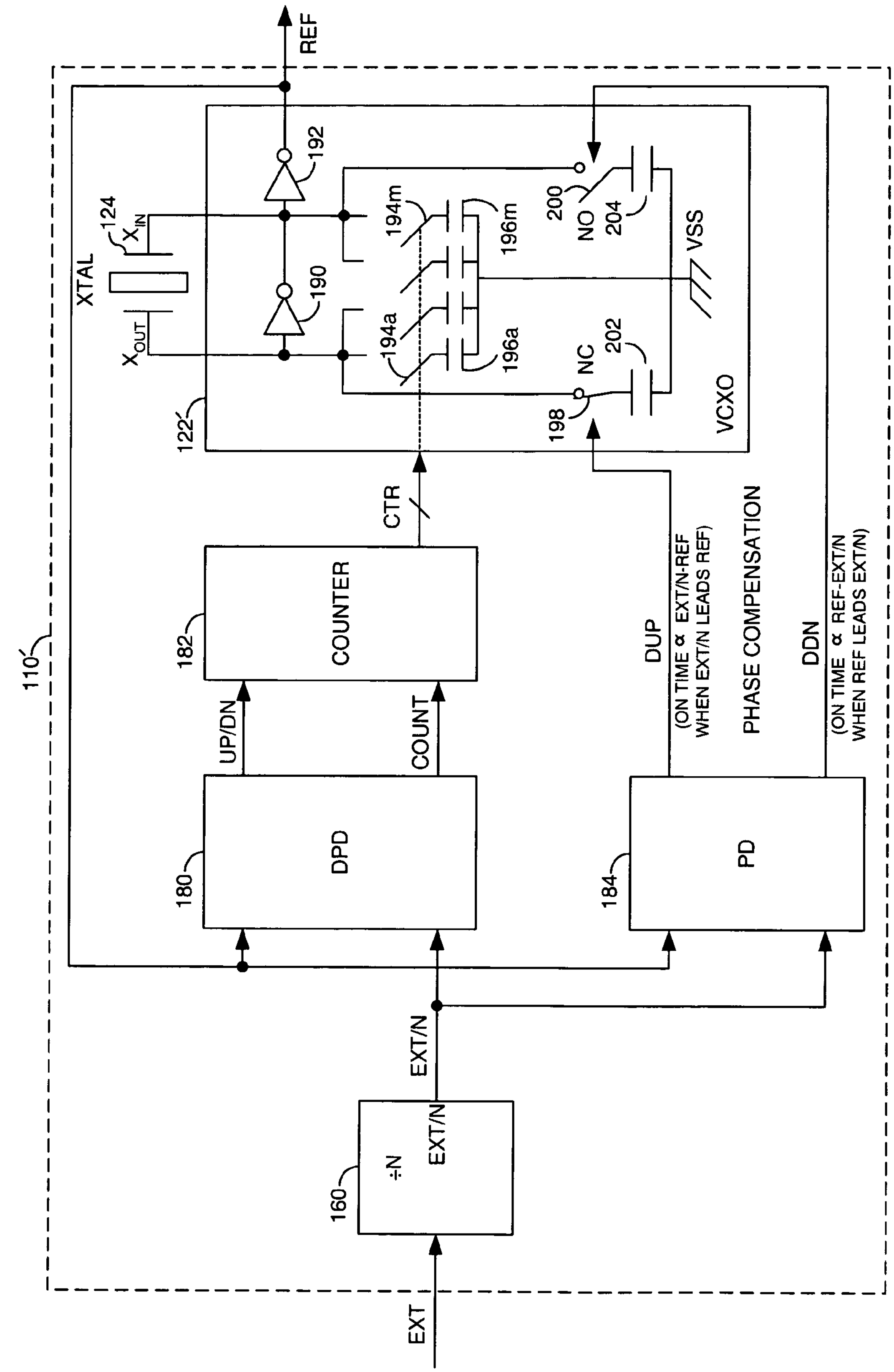
FIG. 4 is a detailed block diagram of an alternative embodiment of a reference loop circuit of FIG. 1.

Referring to FIG. 4, a block diagram of a circuit 110' illustrating an alternative embodiment of the circuit 110 is shown. The circuit 110' may be implemented as a digitally controlled reference loop circuit. In one example, the circuit 110' may comprise a circuit 122', the circuit 160, a circuit 180, a circuit 182, and a circuit 184. The circuit 122' may be implemented as a digitally controlled VCXO. In one example, the circuit 122' may be implemented as a Pierce oscillator. The circuit 180 may be implemented as a digital phase detector circuit. The circuit 182 may be implemented as a digitally controlled up/down counter. The circuit 184 may be implemented as a phase detector circuit.

The circuit 122' may have an input that may receive a signal (e.g., CTR), an input pair that may be coupled to a crystal (e.g., XTAL) or other precision frequency reference (e.g., a ceramic resonator, etc.), an input that may receive a signal (e.g., DUP), an input that may receive a signal (e.g., DDN), and an output that may present the signal REF. The signal CTR may be implemented, in one example, as a multi-bit signal. For example, the signal CTR may be an m-bit digital signal, where m is an integer. The signal CTR may be used to control the frequency and/or phase of the signal REF. The signals DUP and DDN may also be used to control the frequency and/or phase of the signal REF.

In one example, the circuit 122' may comprise a device 190, a device 192, one or more switches 194*a*–194*m*, one or more capacitors 196*a*–196*m*, a switch 198, a switch 200, a capacitor 202, and a capacitor 204. The devices 190 and 192 may be implemented as inverting amplifiers. The element 124 may be connected in parallel with the device 190 and to one or more of the capacitors 196*a*–196*m*, the capacitor 202, and the capacitor 204 via the switches 196*a*–196*m*, 198, and 200 to form an oscillator. The device 190 may have an output that may be connected to an input of the device 192. The device 192 may have an output that may present the signal REF.

The switches 194*a*–194*m* may be configured to select and deselect the capacitors 196*a*–196*m* in response to the signal CTR. A number of the switches 194*a*–194*m* may have a first terminal connected to an input of the device 190 and the remainder of the switches 194*a*–194*m* may have a first terminal connected to the output of the device 190. In one example, the switches may be evenly divided between the input and the output of the device 190. The capacitors 196*a*–196*m* may each have a first terminal connected to a second terminal of the switches 194*a*–194*m*, respectively, and a second terminal connected to a supply ground (e.g., VSS). The capacitors 196*a*–196*m* may be binary weighted. The switches 194*a*–194*m* may be configured to couple one or more of the capacitors 196*a*–196*m* to the device 190 in response to the signal CTR. The least significant bit of the signal CTR may control the switch 194*a*–194*m* connected to the smallest capacitor 196*a*–196*m*, the next most significant bit of the signal CTR may control the capacitor 196*a*–196*n* that is twice as large, etc.

The switch 198 may have a first terminal connected to the input of the device 190 and a second terminal connected to a first terminal of the capacitor 202. The capacitor 202 may have a second terminal connected to the supply ground VSS. The switch 198 may be implemented as a normally closed switch. In one example, the switch 198 may be configured to disconnect the capacitor 202 from the device 190 in response to the signal DUP. In another embodiment, the switches 198 and 200 and the capacitors 202 and 204 may be implemented on both the input and output of the inverting amplifier 190.

The switch 200 may have a first terminal connected to the output of the device 190 and a second terminal connected to a first terminal of the capacitor 204. The capacitor 204 may have a second terminal connected to the supply ground VSS. The switch 200 may be implemented as a normally open switch. In one example, the switch 200 may be configured to select the capacitor 204 in response to the signal DDN. The capacitors 202 and 204 may each be sized similarly to the capacitors 194*a*–194*m* that are controlled by the least significant bit of the signal CTR. Selection of the capacitors 194*a*–194*n*, 202, and 204 generally retards the phase (e.g., decreases the frequency) of the signal REF. De-selection of the capacitors 194*a*–194*n*, 202, and 204 generally advances the phase (e.g., increases the frequency) of the signal REF.

The circuit 180 may have an input that may receive the signal REF, an input that may receive the signal EXT/N, an output that may present a signal (e.g., UP/DN), and an output that may present a signal (e.g., COUNT). The signal UP/DN may control whether the counter 182 is incremented or decremented in response to the signal COUNT. When the signal EXT/N leads the signal REF, the signal UP/DN may be asserted such that the count registered by the circuit 182 will increment. When the signal REF leads the signal EXT/N, the signal UP/DN may be asserted such that the count registered by the circuit 182 will decrement. The signal COUNT may be a clocking signal that may increment/decrement the count registered in the circuit 182. The signal COUNT may be implemented as a pulse at an edge of the signal EXT/N. The circuit 180 may be configured to generate the signals UP/DN and COUNT in response to the signals REF and EXT/N.

The circuit 182 may have an input that may receive the signal UP/DN, an input that may receive the signal COUNT, and an output that may present the signal CTR. The circuit 182 may be configured to generate the signal CTR in response to the signals UP/DN and COUNT. When the signal EXT/N is lost or not asserted, the circuit 180 may not receive an edge of the signal EXT/N and therefore may not produce the signal COUNT. The circuit 182 generally maintains the value of the signal COUNT when the signal EXT/N is lost.

The circuit 184 may have an input that may receive the signal REF, an input that may receive the signal EXT/N, an output that may present the signal DUP, and an output that may present the signal DDN. The circuit 184 may be configured to generate the signals DUP and DDN in response to the phase difference between the signals REF and EXT/N. When the signal EXT/N leads the signal REF, the signal DUP may have an “ON” time that is proportional to the phase difference of the signal EXT/N minus the signal REF. When the signal REF leads the signal EXT/N, the signal DDN may have an “ON” time that is proportional to the phase difference of the signal REF minus the signal EXT/N. The circuit 184 may provide phase compensation (e.g., damping) to the circuit 110'. The circuit 184 may provide improved loop dynamics and/or reduced phase error when compared with a circuit implemented with only the circuits 122', 160, 180, and 182.

While the invention has been particularly shown and described with reference to the preferred embodiments thereof, it will be understood by those skilled in the art that various changes in form and details may be made without departing from the spirit and scope of the invention.

What is claimed is:

1. An apparatus comprising:

a first circuit comprising (i) a control circuit configured to generate a control signal in response to a first reference signal and a second reference signal and (ii) an oscillator configured to generate said second reference signal in response to said control signal and a timing signal, wherein said control signal is held when said first reference signal is lost; and a second circuit configured to generate one or more output signals in response to said second reference signal and one of said one or more output signals, wherein said one or more output signals have a controlled delay with respect to said first reference signal and said timing signal is generated independently of said one or more output signals.

2. The apparatus according to claim 1, wherein:

a frequency and a phase of said second reference signal are (i) adjusted in response to said first reference signal and (ii) held when said first reference signal is lost.

3. The apparatus according to claim 1, wherein:

said first reference signal comprises an external timing signal.

4. The apparatus according to claim 1, wherein said first circuit comprises a digitally controlled reference loop circuit.

5. The apparatus according to claim 1, wherein said controlled delay is substantially zero with respect to said first reference signal.

6. The apparatus according to claim 1, wherein said second circuit comprises:

a phase locked loop (PLL) circuit configured to generate a clock signal in response to said second reference signal and said one of said one or more output signals.

7. The apparatus according to claim 6, wherein said PLL circuit comprises an analog PLL circuit.

8. The apparatus according to claim 6, wherein said second circuit further comprises:

a buffer circuit configured to generate said one or more output signals in response to said clock signal.

9. The apparatus according to claim 1, wherein said second circuit comprises a divide-by-N circuit configured to divide said one of said one or more output signals.

10. The apparatus according to claim 1, wherein said oscillator comprises a voltage controlled crystal oscillator (VCXO).

11. The apparatus according to claim 1, wherein said oscillator is an oscillator selected from the group consisting of voltage controlled oscillators (VCOs), current controlled oscillators (ICOs), digitally controlled oscillators, digitally controlled crystal oscillators, LC oscillators, RC oscillators, and ring oscillators.

12. The apparatus according to claim 1, wherein said control circuit comprises a phase detector circuit configured to adjust a phase of said second reference signal in response to (i) said first reference signal and (ii) said second reference signal.

13. The apparatus according to claim 1, wherein said first circuit further comprises a divide-by-N circuit configured to divide a frequency of said first reference signal.

14. The apparatus according to claim 1, wherein said apparatus is implemented on a single integrated circuit chip.

15. An apparatus for generating one or more output signals comprising:

means for generating a second reference signal in response to (i) a first reference signal and (ii) a crystal oscillator signal, wherein (a) a frequency and a phase of said second reference signal are (i) adjusted in response to said first reference signal and (ii) held when said first reference signal is lost and (b) said crystal oscillator signal is generated independently of said one or more output signals; and means for generating said one or more output signals in response to said second reference signal and one of said one or more output signals.

16. A method of generating one or more output signals comprising the steps of:

(A) generating a second reference signal in response to (i) a first reference signal and (ii) a crystal oscillator signal, wherein a frequency and a phase of said second reference signal are (i) adjusted in response to said first reference signal and (ii) held when said first reference signal is lost and said crystal oscillator signal is generated independently of said one or more output signals; and (B) generating said one or more output signals in response to said second reference signal and one of said one or more output signals.

17. The method according to claim 16, wherein said second reference signal is phase locked to said first reference signal.

18. The method according to claim 16, wherein step A further comprises the step of dividing said first reference signal by an integer value N.

19. The method according to claim 16, wherein a delay of each of said one or more output signals with respect to said second reference signal is one of (i) a controlled delay, (ii) a substantially zero delay and (iii) a controlled substantially zero delay.

20. An apparatus comprising:

a digitally controlled reference loop circuit configured to generate a reference signal in response to (i) an external timing signal and (ii) a crystal oscillator signal, wherein a frequency and a phase of said reference signal are (i) adjusted in response to said external timing signal and (ii) held when said external timing signal is lost; and a second circuit (i) configured to generate one or more output signals in response to said reference signal and one of said one or more output signals and (ii) comprising a divide-by-N circuit configured to divide said one of said one or more output signals, wherein said crystal oscillator signal is generated independently of said one or more output signals.

* * * * *